United States Patent
Noguet et al.

(10) Patent No.: US 12,439,750 B2
(45) Date of Patent: Oct. 7, 2025

(54) LIGHT-EMITTING DIODE WITH THREE-DIMENSIONAL CONTACT STRUCTURE, DISPLAY SCREEN AND ASSOCIATED MANUFACTURING METHOD

(71) Applicant: COMMISSARIAT À L'ÉNERGIE ATOMIQUE ET AUX ÉNERGIES ALTERNATIVES, Paris (FR)

(72) Inventors: Dominique Noguet, Grenoble (FR); Badhise Ben Bakir, Grenoble (FR)

(73) Assignee: COMMISSARIAT À L'ENERGIE ATOMIQUE ET AUX ÉNERGIES ALTERNATIVES, Paris (FR)

(*) Notice: Subject to any disclaimer, the term of this patent is extended or adjusted under 35 U.S.C. 154(b) by 448 days.

(21) Appl. No.: 17/510,951

(22) Filed: Oct. 26, 2021

(65) Prior Publication Data
US 2022/0140219 A1 May 5, 2022

(30) Foreign Application Priority Data
Oct. 29, 2020 (FR) .................................... 2011082

(51) Int. Cl.
*H10H 20/857* (2025.01)
*H10H 20/01* (2025.01)
(Continued)

(52) U.S. Cl.
CPC .......... *H10H 20/857* (2025.01); *H10H 20/01* (2025.01); *H10H 20/819* (2025.01); *H10H 20/84* (2025.01); *H10H 20/0364* (2025.01)

(58) Field of Classification Search
CPC ....... H01L 33/62; H01L 33/005; H01L 33/20; H01L 33/44; H01L 2933/0066;
(Continued)

(56) References Cited

U.S. PATENT DOCUMENTS 8,101,960 B2 * 1/2012 Jeong .................... H01L 33/382
257/E33.05
2003/0141506 A1 7/2003 Sano et al.
(Continued)

FOREIGN PATENT DOCUMENTS

FR         3 073 669 A1    5/2019
KR      20080074474 A  *  8/2008
KR     10-2016-0054331 A  5/2016

OTHER PUBLICATIONS

Search Report as issued in French Patent Application No. 2011082, dated Jun. 25, 2021/.
(Continued)

*Primary Examiner* — Bitew A Dinke
(74) *Attorney, Agent, or Firm* — Pillsbury Winthrop Shaw Pittman LLP

(57) ABSTRACT

A light Emitting Diode includes a lower layer, an upper layer and between them an emissive structure suitable to emit a light radiation when an electric current passes through it. The upper layer is delimited by an upper surface, through which a portion at least of the light radiation exits. The lower layer is delimited by a lower surface for injecting electric charges. The upper surface forms a non-planar three-dimensional structure with hollow patterns and is covered by a contact structure made of one or several electrically-conductive materials, which extends against the surface, conforming to this non-planar surface.

12 Claims, 8 Drawing Sheets

(51) Int. Cl.
*H10H 20/819* (2025.01)
*H10H 20/84* (2025.01)

(58) Field of Classification Search
CPC ... H01L 25/0753; H01L 33/22; H01L 33/387; H01L 33/382; H01L 33/38; H01L 27/156
See application file for complete search history.

(56) References Cited

U.S. PATENT DOCUMENTS

| | | | | |
|---|---|---|---|---|
| 2005/0211995 | A1* | 9/2005 | Ou | H01L 33/22 257/E33.068 |
| 2007/0290224 | A1* | 12/2007 | Ogawa | H01L 33/0093 257/E33.074 |
| 2008/0303047 | A1* | 12/2008 | Shen | H01L 33/22 257/E33.073 |
| 2009/0050909 | A1* | 2/2009 | Chen | H01L 33/20 257/E33.001 |
| 2009/0087994 | A1* | 4/2009 | Lee | H01L 33/20 438/704 |
| 2009/0152583 | A1* | 6/2009 | Chen | H01L 33/14 257/98 |
| 2010/0052000 | A1* | 3/2010 | Ko | H01L 33/22 257/98 |
| 2010/0133570 | A1* | 6/2010 | Jang | H01L 33/20 257/98 |
| 2010/0301362 | A1 | 12/2010 | Iizuka et al. | |
| 2011/0114980 | A1* | 5/2011 | Lee | H01L 33/20 257/E33.072 |
| 2011/0233514 | A1* | 9/2011 | Lu | H01L 33/20 257/13 |
| 2011/0260189 | A1* | 10/2011 | Kim | H01L 33/405 257/E33.072 |
| 2012/0080707 | A1* | 4/2012 | Jang | H01L 33/38 257/E33.073 |
| 2012/0153332 | A1* | 6/2012 | Tu | H01L 33/145 257/E33.074 |
| 2012/0161185 | A1* | 6/2012 | Wang | H01L 33/08 257/98 |
| 2013/0214322 | A1* | 8/2013 | Eissler | H01L 33/382 438/28 |
| 2013/0299858 | A1* | 11/2013 | Kar | H01L 33/40 257/98 |
| 2013/0328077 | A1* | 12/2013 | Chen | H01L 33/405 257/E33.072 |
| 2015/0048380 | A1* | 2/2015 | Koike | H01L 22/12 438/16 |
| 2016/0049545 | A1* | 2/2016 | Choi | H01L 33/06 977/734 |
| 2018/0006188 | A1* | 1/2018 | Seong | H01L 33/0075 |
| 2019/0067516 | A1* | 2/2019 | Tu | H01L 33/18 |
| 2021/0305464 | A1* | 9/2021 | Herner | H01L 27/15 |

OTHER PUBLICATIONS

Sun, J., et al., "p-GaN surface treatments for metal contacts," Applied Physics Letters, vol. 76, No. 4, Jan. 2000, pp. 415-417.
Guo, X., et al., "Efficiency of GaN/InGaN light-emitting diodes with interdigitated mesa geometry," Applied Physics Letters, vol. 79, No. 13, Sep. 2001, pp. 1936-1938.

* cited by examiner

LIGHT-EMITTING DIODE WITH THREE-DIMENSIONAL CONTACT STRUCTURE, DISPLAY SCREEN AND ASSOCIATED MANUFACTURING METHOD

CROSS-REFERENCE TO RELATED APPLICATIONS

This application claims priority to French Patent Application No. 2011082, filed Oct. 29, 2020, the entire content of which is incorporated herein by reference in its entirety.

FIELD

The instant technology relates to a light-emitting diode, to a display screen comprising an array of light-emitting diodes and to an associated method of manufacturing.

BACKGROUND

The last few years have seen the development and the improvement of light-emitting diode display screens, in particular based on microLEDs (in what follows, the expression "light-emitting diode" and the acronym "LED" shall be used indifferently).

In such a screen, each pixel comprises for example three or four elementary sources of light (in order to obtain a colour display), each being a light-emitting diode. These different light-emitting diodes are electrically controlled independently from one another to form the image to be displayed. Note that such a colour screen can possibly include different screens, each one monochrome but of different colours, which make it possible to obtain a colour image by recombining the light radiations produced by these different screens.

FIG. 1 shows a light-emitting diode 1" of such a LEDs screen, as a cross-section, view from the side.

The LED 1" comprises a lower layer 2", an upper layer 3", and, between the two, an active layer 4" configured to emit a light radiation when an electric current passes through it.

The lower layer 2" is for example an anode layer, at least partially made of a P-type doped semiconductor, while the upper layer 3" is a cathode layer, at least partially made of an N-type doped semiconductor. These two layers 2" and 3" can each be made in the form of a stack of several sublayers (of which only some are doped, for example), or, on the contrary, in the form of the same layer in a single piece. The active layer 4" comprises for example a stack of planar quantum wells.

The electric current that supplies the LED is injected into the lower layer 2" thanks to a metal contact layer 5", that extends against the lower face 20" of the lower layer 2" (lower face which is plane).

The light radiation produced by the LED exits from this device via the upper face 30" of the upper layer 3". This upper face can be covered with a protective layer 6", for example a silica or alumina layer.

In such a screen, two neighbouring LEDs are laterally separated from one another by a trench, that extends perpendicularly (or quasi-perpendicularly) to the layers 2", 3", 4", over the entire height of the LEDs. The lateral faces of this trench are covered with an electrically insulating layer 7", and the trench is then filled with a metal 8" that slightly overflows onto the upper face 30" in order to ensure the electrical connection of the cathode layer 3". This metal structure thus forms a vertical wall (used to optically separate the two LEDs from one another) with, at its top, a portion forming an edge that extends transversally, overhanging, to cover a small portion of the upper face 30" in order to form a contact pad 9". This contact pad 9" covers only a portion of the upper face 30" in order to not hinder the exiting of the light radiation produced.

In order to increase the display resolution, or to produce increasingly smaller screens, it is currently sought to produce LEDs, such as described hereinabove, having increasingly smaller lateral dimensions, for example of a few microns (typically, less than 5 microns).

But for such a LED, of micronic dimensions, the electrical contact between the contact layer 5" and the lower layer 2", or between the contact pad 9" and the upper layer 3", takes place on a particularly small surface area, and so the contact resistance has a high value.

This high contact resistance locally leads to a heating of the LED which results in a decrease in its performance. This unfavourable effect is accentuated by the fact that the electric current density is high, in the contact zone (since the contact surface is reduced), which reduces the quality of the electrical contact at the metal-semiconductor junction and potentially also the service life of the component.

This disadvantage manifests itself both at the lower face 20", and at the contact between the upper face 30" and the contact pad 9".

Moreover, in a LED such as shown in FIG. 1, the extraction efficiency is often low: only a small portion of the light power emitted by the active layer finally exits from the LED, due in particular to the high value of the optical index of the semiconductors employed.

The light extraction can be improved by etching the upper face 30" to obtain a photonic crystal made of dielectric material. But in such a device, the extraction efficiency remains nevertheless limited, in particular for a LED of micronic dimensions (indeed, a small extraction photonic crystal generally leads to a limited extraction efficiency).

SUMMARY

To resolve at least some of the problems mentioned hereinabove, the present technology proposes a new type of light-emitting diode comprising a non-planar three-dimensional contact structure.

The present technology proposes more particularly a light-emitting diode comprising:

- a lower layer, at least partially made of a doped semiconductor,
- an upper layer, at least partially made of a doped semiconductor, the lower and upper layers having dopings of opposite types,
- an emissive structure, that extends between the lower layer and the upper layer and that is suitable to emit a light radiation when an electric current passes through it,
- the upper layer being delimited by an upper surface, through which a portion at least of the light radiation exits,
- the lower layer being delimited by a lower surface for injecting electric charges (electrons or holes),
- the upper surface of the upper layer forming a non-planar three-dimensional structure having hollow patterns, the surface being covered by a contact structure made of one or more electrically-conductive materials, the contact structure extending against the surface, conforming to this non-planar surface,
- and wherein, for each of the patterns, an aspect ratio, equal to the extension of the pattern in a direction perpendicular to the layers, divided by a transverse dimension of the pattern in a plane parallel to the layers, is greater than or equal to 2, for example comprised between 2 and 4, or between 2 and 3.5.

The contact structure can in particular fill the hollow patterns.

This three-dimensional structure makes it possible to increase the surface area of the contact surface without increasing the lateral dimensions of the LED (i.e. without increasing the surface occupied by the LED).

By way of example, for a same surface occupied by the LED on the substrate, when the lower surface or the upper surface has a profile with slots with a duty cycle of ½, and defines grooves that are as wide as they are deep, then, the contact surface area is twice as large than if this surface was planar.

This increased contact surface decreases the contact resistance and improves the quality of the electrical contact between the contact structure and the layer to be electrically supplied. In addition, for a given operating current, the current density is reduced in the same proportion as the surface increase, with respect to the case of a planar contact structure.

It can be provided that the lower and upper surfaces both be provided with a three-dimensional contact structure such as presented hereinabove.

In addition to reducing the contact resistance, this particular contact structure, made on the upper surface, makes it possible to obtain particularly high extraction efficiencies.

Detailed digital simulations (of the FDTD type, i.e. by finite differences in the temporal domain) show, by way of example, that an extraction efficiency reaching 50% can be obtained in such a configuration, and this even without in-depth optimisation of the parameters of the contact structure.

For the purposes of comparison, by etching the upper face of the upper layer and by filling the etched zones with a dielectric material to form a photonic crystal (extraction lattice made of dielectric material), at best an efficiency from about 20 to 25% is obtained, after optimisation.

The fact that it is possible to obtain better extraction efficiencies with such a structure, made of conductive material, rather than with a diffractive structure made of a dielectric material, is rather surprising at first glance. Indeed, as a conductive material, one generally employs a metal or a metal alloy, reflective for the light radiation produced. It could therefore be expected that the conductive material, that fills the hollow patterns masks a portion of the light radiation and prevents it from exiting from the upper layer of the LED by somewhat playing the role of a screen. Moreover, it is observed that the contact pads 9" mentioned hereinabove have an unfavourable effect on the extraction efficiency (in practice, they are responsible for a decrease in the extraction efficiency, of a few percentage points, with respect to a situation wherein the upper surface is cleared of any obstacle). However, the three-dimensional contact structure in question makes it possible to obtain particularly high extraction efficiencies. A possible explanation of this effect is that the conductive material in question, that fills the hollow patterns, forms in fact small conductive inclusions in the upper portion of the upper layer, these inclusions playing the role of micro-antennas making it possible to extract the light radiation in question from the layer.

Moreover, the fact that the patterns in question have an aspect ratio higher than 2 favours a directive emission, in particular for a light-emitting diode of reduced dimension (for example less than 3 microns), as illustrated by the results of the digital simulation shown hereinbelow.

Moreover, from an electrical standpoint, the fact that the upper surface is provided with the particular contact structure mentioned hereinabove makes it possible to reduce the contact resistance, in relation to a current injection geometry such as the one of FIG. 1, and, in addition, the electric current is injected in a relatively homogeneous way over the entire section of the LED (instead of injecting it mainly on the flanks of the LED), which further improves its performance.

The contact structure, which thus plays both the role of an extraction lattice and that of a structure for injecting electric charges of a larger surface, thus makes it possible to considerably improve the performance of the LED.

This contact structure can comprise:
a first electrically-conductive material, that fills the hollow patterns, and
a contact layer made of a second electrically-conductive material that is at least partially transparent for the light radiation, the contact layer covering the upper surface and coming into contact with the first electrically-conductive material.

This contact layer allows the light radiation produced to pass while still electrically connecting the inclusions, formed of the first conductive material, thus making it possible to connect all of the upper surface to an electrical power supply.

In addition to the characteristics mentioned hereinabove, the light-emitting diode described hereinabove can have one or more of the following additional characteristics, taken individually or according to any technically permissible combination:
the contact structure covers the major portion, or even all of the surface;
the patterns, regularly repeated, form a periodic lattice of pitch p or a quasi-periodic lattice;
the patterns form the periodic lattice of pitch p, and, for each of the patterns, a ratio equal to the transverse dimension of the pattern divided by the pitch p of the lattice is comprised between 20% and 40%;
the light-emitting diode occupies, in a plane parallel to the layers, a total area less than 100 square microns, or even less than 10 square microns;
the first electrically-conductive material mentioned hereinabove is at least partially reflective for the light radiation;
the first material is a metal or a metal alloy;
the second material is a metal oxide;
for the light radiation, the contact layer has an optical power absorption coefficient less than 20%, or even less than 10%;
the upper surface occupies, in projection on a plane parallel to the layers, a total front surface area $A_T$, the hollow patterns, occupy, in projection on a plane parallel to the layers, a recessed surface area $A_R$, and a filling rate, equal to the recessed surface area $A_R$ divided by the total front surface area $A_T$, is less than 50%, or even less than 30%;
the upper surface, that forms the three-dimensional structure, extends between a front plane and a recessed rear plane, the front and rear planes being parallel to the layers, and the first conductive material, that fills the hollow patterns, forms one or more inclusions that extend beyond the front plane, into the contact layer;

the inclusions made of first conductive material, that fill the hollow patterns, are electrically connected to one another;

the light-emitting diode comprises an anti-reflective layer that extends over the contact layer;

the anti-reflective layer is formed from at least one dielectric material having an optical index different from the optical index of the contact layer, the anti-reflective layer being configured in such a way as to reduce the reflection coefficient in power on the upper face of the contact layer, for the light radiation, with respect to a light-emitting diode devoid of this anti-reflective layer;

the upper surface and the lower surface each form a non-planar three-dimensional structure having hollow patterns, covered by a contact structure such as described hereinabove;

each of the conductive materials has an electrical conductivity, at room temperature, greater than or equal to $10^5$ Siemens per metre;

the patterns have, in one direction at least (for example a direction perpendicular to the layers, or parallel to the layers), a dimension (i.e. an extension, representative of the size of the pattern, such as a height, a width or a diameter) greater than 0.1 micron, or even greater than 0.3 micron or even greater than 0.5 micron; note in particular that the patterns in question do not correspond to irregularities, such as can be found on rough layers;

the different patterns, or at the least most of the patterns have the same shape and/or the same size;

The total number of patterns is greater than or equal to 5, or even to 9.

The present technology also relates to a display screen comprising an array of light-emitting diodes such as described hereinabove.

The present technology also relates to a method for manufacturing a light-emitting diode, comprising the following steps:

making a stack comprising:
a lower layer, at least partially made of a doped semiconductor,
an upper layer, at least partially made of a doped semiconductor, the lower and upper layers having dopings of opposite types, and
an emissive structure that extends between the lower layer and the upper layer and that is suitable to emit a light radiation when an electric current passes through it,
transferring the stack thus made on a final substrate, the lower layer being located on the side of the substrate,
the method further comprising the following steps:
etching of an upper surface of the upper layer to form a non-planar three-dimensional structure having hollow patterns, each of the patterns having an aspect ratio, equal to the extension of the pattern in a direction perpendicular to the layers, divided by a transverse dimension of the pattern in a plane parallel to the layers, that is greater than or equal to 2, and
on the surface thus etched, making a contact structure made of one or more electrically-conductive materials, the contact structure extending against the surface, conforming to this non-planar surface.

The present technology and its different applications will be better understood when reading the following description and examining the figures that accompany it.

BRIEF DESCRIPTION OF THE FIGURES

The figures are shown for the purposes of information and are in no way limiting.

DETAILED DESCRIPTION

Figure 2:
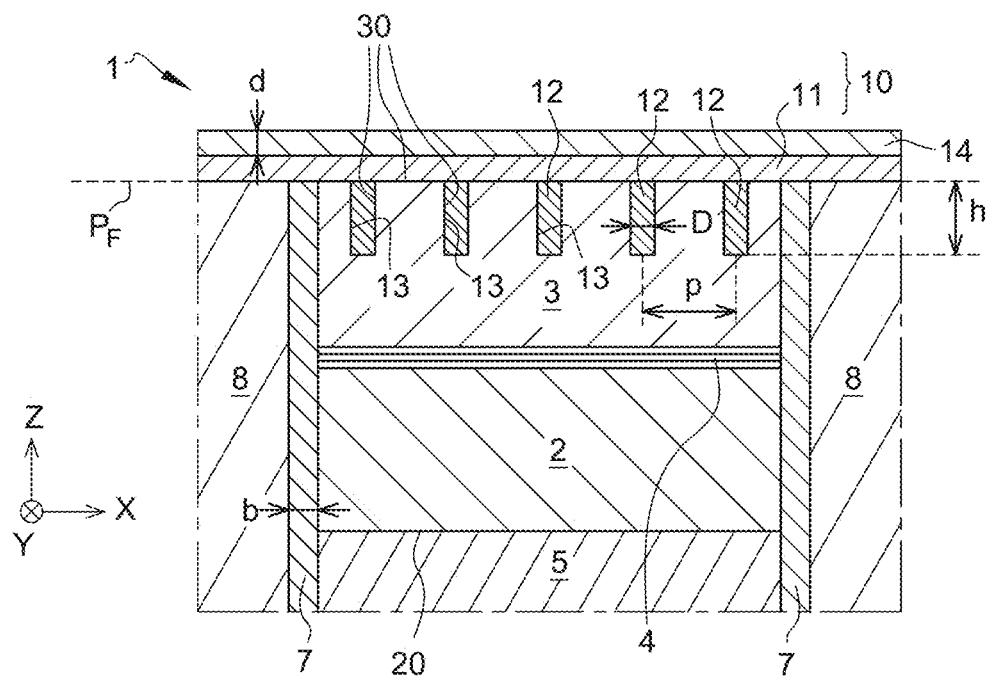
FIG. 2 diagrammatically shows a light-emitting diode according to a first embodiment, as a cross-section and side view.
Figure 10:
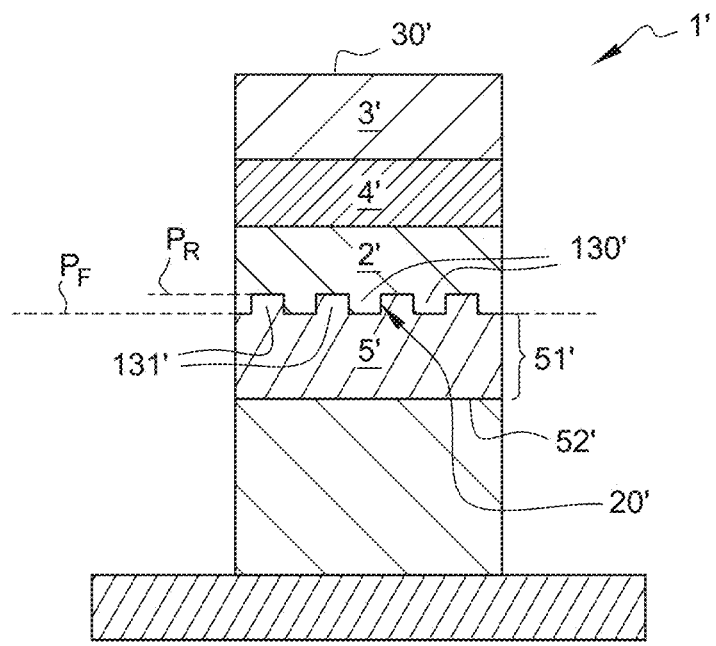
FIG. 10 diagrammatically shows a light-emitting diode according to a second embodiment, as a cross-section and side view.

As indicated hereinabove, the present technology relates to a light-emitting diode 1; 100; 1' comprising a particular three-dimensional contact structure 10; 5', made on a lower layer 2', on an upper layer 3, or both on the lower layer and on the upper layer of the LED so as to electrically supply it (FIGS. 2 and 10).

In a first embodiment, the contact structure in question is made on the upper layer of the LED. Two alternatives of the LED 1; 100, in accordance with this first embodiment, are diagrammatically shown in FIGS. 2 and 9.

A second embodiment, wherein it is the lower layer 2' of the LED 1' that is provided with this contact structure 5', is diagrammatically shown in FIG. 10.

Despite a few differences, the different alternatives of the first embodiment presented hereinbelow have many points in common. Also, from one alternative to another, identical or corresponding elements will generally be marked with the same reference numbers and will not necessarily be described each time. For the second embodiment, the reference numbers are generally accompanied by a prime "'", while they are devoid of a prime, in the first embodiment.

The overall structure of the LED 1; 100; 1' will be presented in a first step. The particular contact structure 10; 110; 5' that equips the LED will then be described in more detail, for the first and then for the second embodiment. A display screen 1000 comprising an array of LEDs 1' of this type will be presented hereinafter, as well as an associated method for manufacturing.

Regardless of the embodiment, the LED 1; 100; 1' comprises:
- a lower layer 2; 2', at least partially made of a doped semiconductor, i.e. intentionally doped,
- an upper layer 3; 3', at least partially made of a doped semiconductor, the lower and upper layers having dopings of opposite types, and
- an emissive structure 4; 4' that extends between the lower layer 2; 2' and the upper layer 3; 3' and that is suitable to emit a light radiation when an electric current passes through it.

Here, the emissive structure 4; 4' is in the form of an active layer comprising a stack of one or more planar quantum wells. The term "planar quantum well" here designates a structure comprising:
- a central layer, thin (thickness of about ten nanometres of a few tens of nanometres), formed of a first semiconductor material, and
- two barrier layers that surround the central layer, formed of another semiconductor material that has a band gap that is wider than the band gap of the first material.

The central layer, thin, thus forms a potential well for the electrons and/or the holes.

By way of example, for an emission in the blue, the central layer can be made of indium-gallium nitride InGaN, while the barrier layers are made of gallium nitride GaN. And for an emission in the red it is possible for example to carry out the central layer and the barrier layers in Indium-Gallium Phosphide InGaP and in Aluminium-Indium-Gallium Phosphide AlInGaP. More generally, when it is desired to obtain an emission in the visible domain, the active layer can be made from semiconductor III-V materials, i.e. comprising an element from column V of the periodical table of elements (N, As, P) combined with one or more elements from column III of the periodical table of elements (Ga, Al, In).

The lower 2; 2' and upper 3; 3' layers can each be of a single piece. For example, when the active layer is formed of InGaN/GaN wells, the lower and upper layers can each be carried out in the form of a layer of a single piece made of gallium nitride GaN, N-type doped for one, and P-type doped for the other.

The lower 2; 2' and upper 3; 3' layers can also each be formed by a stack of several sublayers. And it can be provided that only some of these sublayers be doped. Thus, when the active layer is formed for example of AlInGaP/InGaP wells, it can be provided that:
- the lower layer 2; 2' comprise a lower sublayer made of P-type doped Gallium Arsenide GaAs, as well as an upper sublayer, thicker, made of Aluminium-Indium Phosphide AlInGaP,
- the upper layer 3; 3' then comprising a lower sublayer, thick, made of AlInGaP, and a thinner upper sublayer, made of N-type doped GaAs.

In any case, the upper layer 3; 3' is delimited, in the upper portion, by an upper surface 30; 30'. It is via this surface that the light radiation produced exits from the LED 1; 100; 1'. In other terms, this light radiation passes through the upper surface 30; 30', to exit from the LED 1; 100; 1'.

Regarding the lower layer 2; 2', it is delimited, in the lower portion, by a lower surface 20; 20' through which is injected or through which exits the electric current that supplies the LED.

The layers 2 and 3 or 2' and 3' are parallel to the substrate which is used as a support for the LED 1; 100; 1'.

The stack comprising the lower layer, the emissive structure and the upper layer is delimited laterally by a lateral surface, that extends perpendicularly to the layers 2, 3; 2', 3' and that is covered by an electrically-insulating layer, 7, for example made of silica (FIG. 2). The insulating layer 7 is itself covered by a metal layer 8, reflective, at least partially, for the light radiation produced. This layer forms one or more vertical walls playing a role of reflector, around the LED 1; 100; 1'. It also makes it possible to optically isolate one LED from another, when several adjacent LEDs are made on the same substrate.

In the embodiments described here, the LED 1; 100; 1' has micronic lateral dimensions, the LED having a maximum extension less than 10 microns, or even less than 3 microns, in a plane parallel to the substrate. The layers 2 and 3 or 2' and 3' then have lateral dimensions less than 10 microns, or even less than 3 microns. In practice, these lateral dimensions can for example be equal to 1 or to 2 microns. The term "lateral dimension", or "transverse dimension" designates a dimension of the layer considered, for example a width, a length, or a diameter of this layer, in a plane parallel to the substrate.

In a plane parallel to the substrate, the LED 1; 100; 1' then occupies a total area less than 100 square microns, or even less than 10 square microns. In other terms, on the substrate in question, the LED occupies less than 100 square microns, or even less than 10 square microns. The upper and lower surfaces then each have, in projection on this plane, a total surface area, called total front surface area $A_T$, less than 100 square microns, or even less than 10 square microns.

Figure 3:
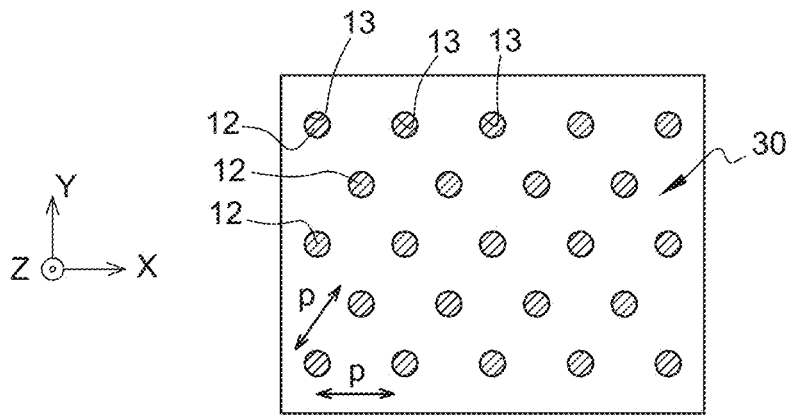
FIG. 3 diagrammatically shows a portion of the light-emitting diode of FIG. 2, seen from above.
Figure 4:
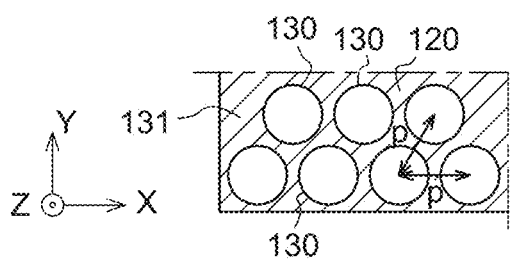
FIG. 4 is a partial diagrammatical view, from the top, of a light-emitting diode according to an alternative of the first embodiment.

Remarkably, at least one of the two upper and lower surfaces forms a non-planar three-dimensional structure having hollow 13; 23 or protruding 130; 130' patterns (FIGS. 3, 4 and 10). This surface is covered by the contact structure 10; 110; 5' mentioned hereinabove. This contact structure 10; 5' is made of one or more electrically-conductive materials and it extends against the surface in question, 30; 20', by filling the hollow patterns 13 (FIGS. 2 and 3), or the space 131; 131' located between the protruding patterns 130; 130' (FIGS. 2, 3, 5, 6 and 10).

This three-dimensional structure makes it possible to electrically connect the layer considered (lower or upper), on a surface having a surface area that is more substantial than the total front surface area $A_T$ of the layer. The surface area on which the electrical contact is made is thus increased (which decreases the contact resistance by as much), without increasing the lateral dimensions of the LED.

In practice, at least one of the two upper and lower surfaces is etched to form these hollow, or protruding, patterns. And the electrically-conductive material, or one of the electrically-conductive materials that forms the contact structure 10; 110; 5' fills the zones that were thus etched.

The conductive material or materials in question, which are used to electrically connect the layer considered, lower or upper, so as to electrically supply the LED 1; 100; 1', each have an electrical conductivity that, at room temperature (20 degrees Celsius), is for example greater than $10^5$ Siemens per metre. Each one of these conductive materials can have a band structure that is that of a metal, of a semi-metal, or possibly of a (highly doped) semiconductor.

In the case of FIG. 2, the patterns are hollow patterns 13, here cylindrical holes, distributed over the upper surface 30, and each filled with a first electrically-conductive material (material represented by hatches, in FIG. 3).

Figure 5:
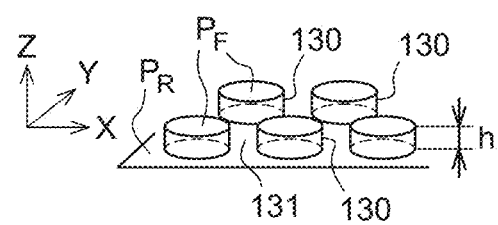
FIG. 5 is a partial diagrammatical view, in perspective, of the light-emitting diode of FIG. 4.

FIGS. 4 and 5 show an alternative of the first embodiment, wherein the patterns are protruding patterns 130, here cylindrical pillars. In this case, the space 131 between these pillars is filled with the first electrically-conductive material (material represented by hatches, in FIG. 4).

Whether the patterns are hollow or protruding, the surface in question (namely the upper surface, or the lower surface) extends between a front plane $P_F$ and a recessed rear plane $P_R$, (see for example FIGS. 2, 5, 10). The most protruding portions of this surface are located in the front plane $P_F$ (in the case of FIG. 10, that shows the second embodiment, the front plane $P_F$ is located below the plane $P_R$, because the patterns 130' protrude downwards). These two planes $P_F$, $P_R$ are parallel to the plane of the layers 2, 3; 2', 3'. A conductive material, for example the first conductive material mentioned hereinabove, fills (i.e. occupies) at least the zone that extends from the front plane $P_F$ to the surface etched itself, i.e. the zone that extends from the front plane $P_F$ to the recessed portion of this surface. In the case where the patterns are protruding patterns (FIGS. 4 and 10), it is this zone (which bears the reference 131, or 131') that is designated as "the space located between the protruding patterns».

In the embodiments described here, the conductive material or materials that form the contact structure 10; 110; 5' occupy:

not only the zone that extends from the front plane $P_F$ to the recessed portion of the etched surface 30; 20', but also a zone located beyond the front plane $P_F$ in question, by thus forming a contact layer 11; 31; 51' that covers the etched surface in question.

This contact layer 11; 31; 51' is parallel to the other layers of the LED.

Figure 9:
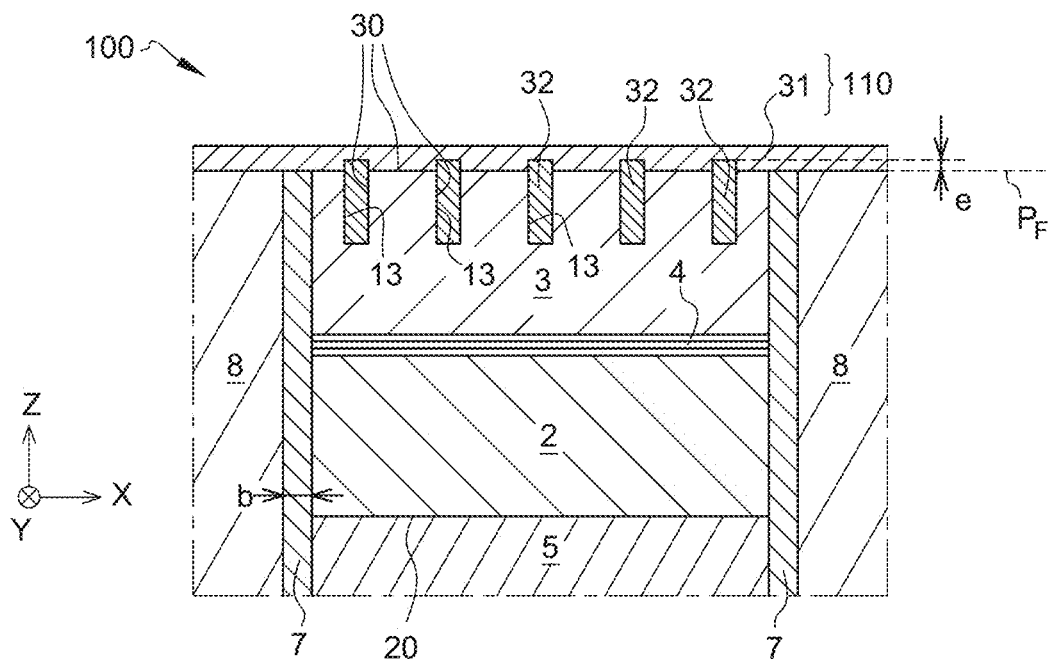
FIG. 9 diagrammatically shows a light-emitting diode according to yet another alternative of the first embodiment, as a cross-section and side view.

In the case where the patterns are hollow patterns 13 this contact layer 11; 31 makes it possible to electrically connect (to an external source) the inclusions 12; 32 of conductive material that fill these hollow patterns 13, in order to be able to inject or extract electric charges at these inclusions conductrices (FIGS. 2 and 9).

When the contact structure 10; 110 is made on the upper surface 30 (first embodiment), the contact layer 11; 31 in question is formed of a second conductive material that is at least partially transparent for the light radiation produced, in order to allow this light radiation to exit from the LED 1; 100.

On the other hand, when the contact structure 5' is made on the lower surface 20' (second embodiment), the contact layer 51' can indeed be opaque, or reflective for the light radiation produced by the LED. In this case, the contact structure 5' can in particular be of a single piece, the same conductive material, for example a metal or a metal alloy then filling the hollow patterns, or the space located between the protruding patterns, and overflowing beyond to form the contact layer 51' that covers all the surface in question.

The first embodiment, wherein the upper surface 30 is provided with the three-dimensional contact structure in question, 10; 110, is now described in more detail, in reference to FIGS. 2 to 9.

First Embodiment: Three-Dimensional Contact Structure Made on the Upper Layer of the LED As already indicated, in this embodiment, the hollow patterns 13; 23, or the space 131 between the protruding patterns 130, are filled by a first electrically-conductive material, and the contact layer 11; 110, that covers all the upper surface 30, is made of a second electrically-conductive material that is at least partially transparent for the light radiation produced. The contact layer 11; 31 extends against the protruding portions (front portions) of the upper surface 20, and also comes into contact with the first conductive material (that fills the recessed zones).

For the light radiation produced by the LED, the contact layer 11; 31 can for example have an absorption coefficient, in power, less than 20%, or even less than 10%, for all the layer (this coefficient is equal to the absorbed power in the contact layer, divided by the power that penetrates into the latter). For the light radiation in question, the second conductive material can for example have an absorption coefficient (in power) less than 0.3 per micron, or even less than 0.1 per micron.

The second conductive material is for example a conductive metal oxide and transparent such as ITO ("indium tin oxide", comprising more precisely indium oxide $In_2O_3$ and tin oxide $SnO_2$), IZO (Zinc oxide ZnO doped with Indium In), or AZO (Zinc oxide ZnO doped with Aluminium Al). Here, this second material is ITO.

Here, the first conductive material is reflective for the light radiation in question, contrary to the second conductive material. Its reflection coefficient in power (for an interface that would be planar) is for example greater than 80%, or even greater than 90%.

As the inclusions formed by this first material play the role of antennas, making it possible to extract the light radiation emitted by the active layer, the first material beneficially has optical properties that are comparable to those of a metal (and it can be a metal). In particular, in the frequency domain of the light radiation, the real part of the relative dielectric permittivity $\varepsilon_r$ of the first material is negative, and has a high absolute value, for example greater than 3, or even greater than 15.

Here, the first material is a metal (for example a transition metal), or a metal alloy. The first material can for example be gold based, silver based, titanium based or aluminium based.

The hollow patterns 13; 23 or protruding patterns 130 can, as here, be regularly repeated to form a periodic lattice of pitch p, or a quasi-periodic lattice. The term "quasi-periodic lattice" designates a lattice that has a diffraction figure formed of discrete peaks (as for a periodic lattice), the lattice however being non-periodic (the lattice has a kind of regularity, but is not strictly speaking periodic).

The metal inclusions 12; 32 that fill the hollow patterns 13 (or the metal inclusion 120 that fills the space 131 located between the protruding patterns 130) thus form a metal lattice, that then plays a role of an extraction lattice for the light radiation produced by the emissive structure 4. This lattice can be one- or two-dimensional.

Using such a periodic or quasi-periodic arrangement makes it possible not only to improve the effectiveness of the extraction of the light radiation produced by the emissive structure 4, but it also makes it possible to give the extracted light beam a determined shape, and possibly polarisation. This lattice thus makes it possible to adapt the light beam emitted by the LED 1; 100 to the target application, with much flexibility.

From the standpoint of the profile of the beam, digital simulations show that the metal lattice in question, makes it possible to obtain good directivity in the far field, even when the upper surface 30 has reduced lateral dimensions (for example dimensions of about a micron).

Figure 7:
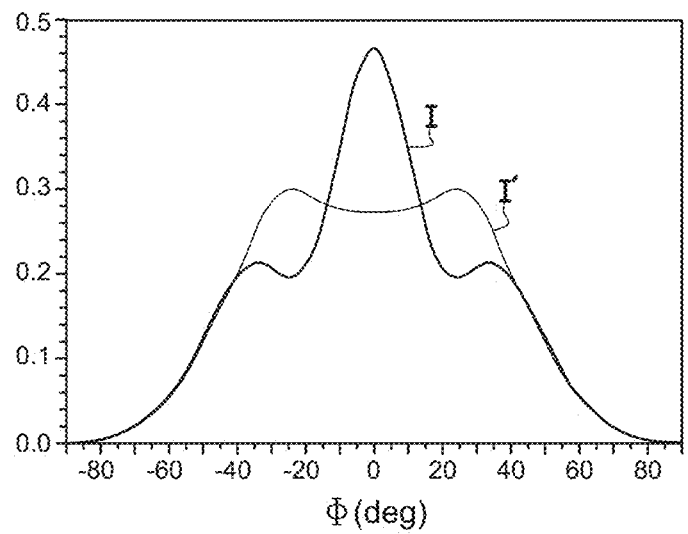
FIG. 7 diagrammatically shows a far field light intensity profile, for the light-emitting diode of FIG. 2, and a light intensity profile obtained with a similar light-emitting diode, but devoid of the three-dimensional contact structure mentioned hereinabove.

FIG. 7 shows by way of example, for the LED of FIG. 2, the change in the light intensity I obtained in the far field, as a function of the angle ϕ formed between the direction of propagation considered and an axis Z perpendicular to the layers 2, 3 of the LED. The angle ϕ is expressed in degrees, in this figure. The curve I(ϕ) was obtained by digital simulation, in a case where the upper surface 30 has a width equal to about 1.6 times the average wavelength λ of the radiation emitted (average wavelength in a vacuum). Despite the smallness of the LED, a satisfactory directivity is obtained, since the curve I(ϕ) forms a peak with a total width at half-maximum of about 40 degrees. The results of this digital simulation moreover show, in this configuration, that an extraction efficiency of about 50% is obtained (ratio between the total light power radiated in the far field, and the light power initially emitted by the emissive structure 4, inside the materials forming the LED 1).

Figure 1:
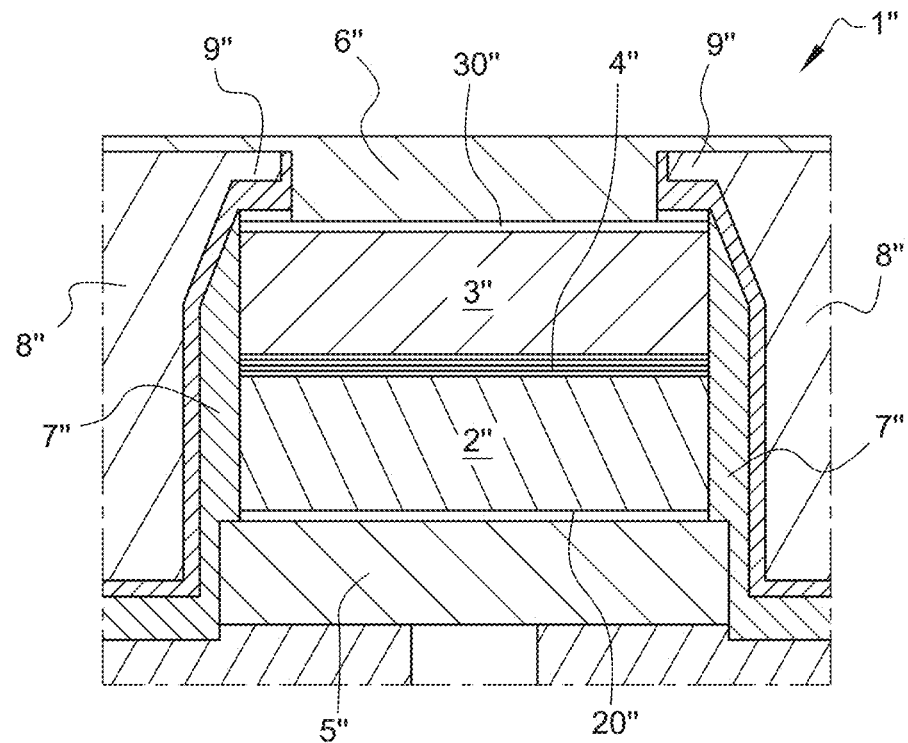
FIG. 1 diagrammatically shows a light-emitting diode of the prior art, as a cross-section and side view.

FIG. 7 also shows, for the purposes of comparison, the light intensity I' obtained in far field, as a function of the angle ϕ, for a LED identical to the one of FIG. 2 but devoid of the three-dimensional contact structure mentioned hereinabove (and without the holes 13 made in the layer 3). This case corresponds more precisely to a planar upper surface, covered with an insulator, except at the periphery where it is covered by contact pads such as that of FIG. 1 (in order to be able to electrically supply the LED). Each contact pad extends over about 15% of the total width of the upper surface, width which is, here too, equal to about 1.6 times the average wavelength λ. As can be observed, the type of electrical connection of the prior art, implemented in the LED 1" of FIG. 1, is clearly less favourable than the one proposed here, in terms of directivity. Indeed, the curve I'(ϕ) has a total width at half-maximum of about 90 degrees (note that the profile I' was vertically dilated—in the y direction—in order to be visually compared with the profile I; but in fact, the intensity values I' are clearly lower than that of the profile I, in addition to being distributed over a more substantial angular width).

In the case of FIG. 2, the patterns presented by the upper surface 30 are hollow patterns 13, here cylindrical holes filled with the first material, metal. But, as already indicated, these patterns can also be protruding patterns 130 (FIG. 4), and different shapes of pattern and mesh can be considered for this lattice, in particular depending on the shape desired for the light beam emitted.

Four different types of lattices, corresponding to four alternatives of the first embodiment of the LED 1; 100, are shown by way of example in the figures.

The first alternative is that shown in FIGS. 2 and 3. In this case, as already indicated, the patterns are cylindrical holes 13 filled with the first material. The lattice is two-dimensional lattice (i.e. a lattice wherein the pattern 13 is periodically repeated in two different directions of the plane of the lattice). Here, this entails a triangular lattice, of which the elementary mesh is an equilateral triangle.

FIGS. 4 and 5 show a second alternative, wherein the patterns are, as already indicated, protruding patterns 130, here cylindrical pillars. The lattice is here also a triangular lattice.

Figure 6:
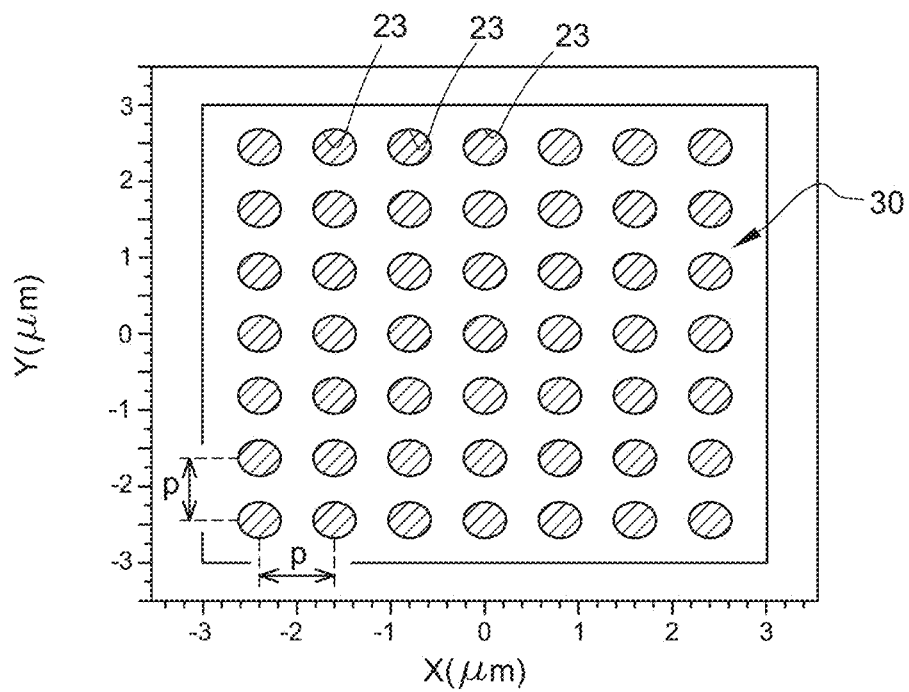
FIG. 6 diagrammatically shows a light-emitting diode according to another alternative of the first embodiment, seen from above.

FIG. 6 shows a third alternative wherein the lattice has a square mesh and wherein the periodically repeated patterns are hollow patterns, here cylindrical holes 23 filled with the first material, metal (as for the first alternative).

FIG. 9 shows a fourth alternative, similar to the first alternative but wherein the metal inclusions 32 that fill the hollow patterns 13 extend beyond the front plane $P_F$ which delimits the upper layer 3. These metal inclusions 32 extend into the contact layer 31, formed from the second material (of which recall is conductive and transparent). For this fourth alternative, the patterns 13 are hollow patterns identical to those of the first alternative, and distributed in the same manner (triangular lattice).

Other types of two-dimensional lattices, for example hexagonal (honeycomb lattice), or corresponding to an Archimedes paving, can be considered, according to the characteristics desired for the light beam extracted. And, as indicated hereinabove, the lattice can also be a quasi-periodic lattice. The latter case is more particularly adapted to "macroLEDs", having lateral dimensions greater than 10 microns, for example.

Regardless of the shape of the patterns, and of the mesh, it is possible to provide, as here, a filling rate $\tau_F$ by the metal lattice less than 50%, or even less than 30% or even less than 20%. In practice this filling rate can for example be comprised between 3 and 20%.

The filling rate $\tau_F$ is defined as follows. In projection on a plane parallel to the layers 2, 3, the hollow patterns 13, 23, or the space 131 located between the protruding patterns 130, occupy an area called recessed surface area $A_R$ (this is somewhat the total front surface area of the zones filled by the first conductive material). For example, in the case of FIG. 3, where the lattice comprises N cylindrical holes each having a diameter D, the recessed surface area $A_R$ is $N \times \pi D^2/4$. In any case, the filling rate $\tau_F$ is equal to the recessed surface area $A_R$, divided by the total front surface area $A_T$ of the upper surface 30: $\tau_F = A_R/A_T$.

For the purposes of comparison, for photonic crystals made of dielectric material (instead of being made of metal), the filling rates used are generally close to 50% (so as to optimise the extraction efficiency).

The filling rate therefore has a relatively low value, here, with respect to photonic crystals made of dielectric materials. For the metal lattice used here, this moderate filling rate (typically 3 to 20%) makes it possible to increase the extraction efficiency.

Instead of being represented by the filling rate $\tau_F$, which is surface, the more or less substantial presence of patterns 13 on the surface 30 can be represented by a (linear) filling fraction FF equal to:
- the transverse dimension of the patterns in question, for example their diameter D when these patterns are cylindrical holes,
- divided by the pitch p of the lattice,
- or FF=D/p.

The rather low filling rates of the metal extraction lattice (which here forms the three-dimensional contact structure), correspond also to reduced values of the filling fraction FF. More precisely, the filling fraction FF can, like here, be less than 40%, for example comprised between 20% and 40%.

Figure 8A:
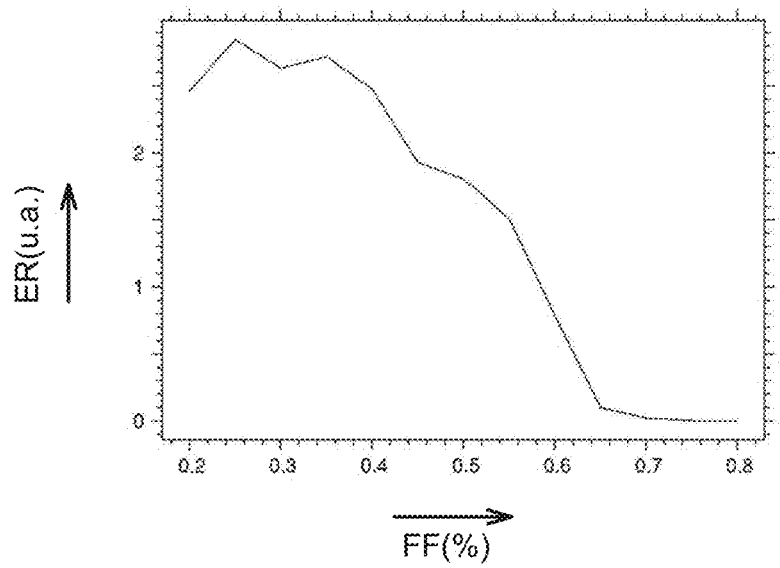
FIG. 8A is a graph showing the influence of a filling fraction of patterns present on an output face of the light-emitting diode of FIG. 2, on an extraction efficiency of a radiation produced in this light-emitting diode.

FIG. 8A shows the influence of the filling fraction FF (expressed as a %) on the extraction efficiency ER (in arbitrary units u.a.). In this figure, the extraction efficiency ER was determined by digital simulation, for inclusions made of Aluminium (the non-perfectly reflective nature of aluminium having been taken into account in these simulations), the height h being 160 nm while the pitch p of the lattice is 200 nm (the diameter D varying, in order to vary the filling fraction FF). As can be seen in this example, the extraction efficiency ER drops when the filling fraction FF becomes greater than about 40%. And when the filling fraction is greater than about two-thirds, the radiation produced is practically no longer extracted, and remains trapped in the structure, where it is absorbed due to the imperfectly reflective nature of the metal inclusions 12.

Figure 8B:
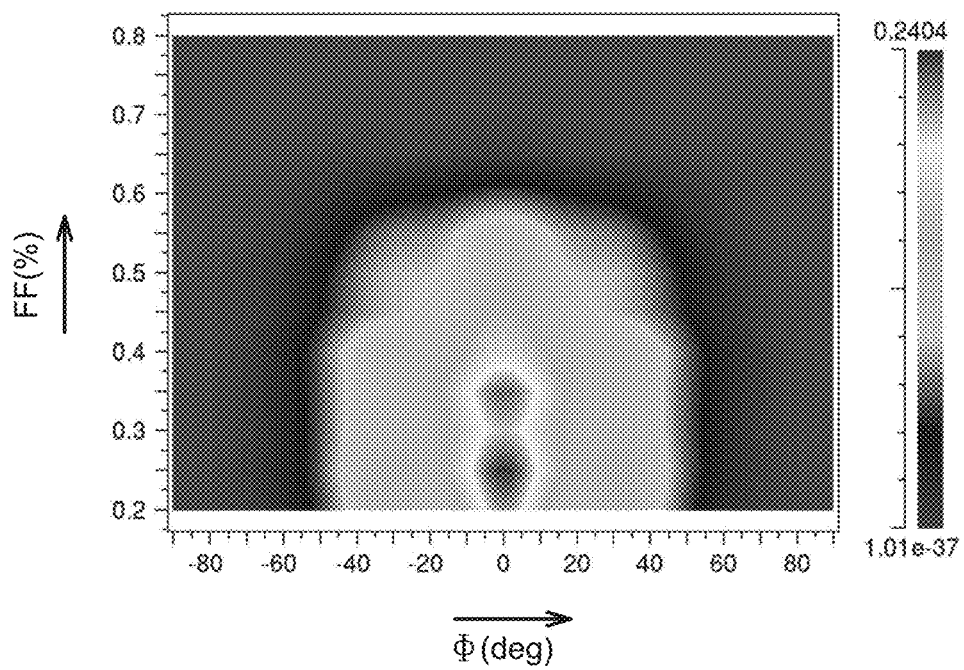
FIG. 8B gathers, in the form of a two-dimensional graph, several light intensity profiles in the far field such as the one of FIG. 7, obtained for different values of this filling fraction.

FIG. 8B shows the influence of the filling fraction FF of the patterns on the directivity in far field, in the case of the LED 1 of FIGS. 2 and 3. This figure brings together, in the form of a two-dimensional graph, several light intensity profiles in the far field such as the one of FIG. 7, these profiles corresponding to different values of the filling fraction FF. The x-axis corresponds to the angle φ (angle corresponding to the direction of propagation considered). It is expressed in degrees. The y-axis corresponds to the filling fraction FF (expressed as a %). For a given point in the plane (φ, FF), the light intensity is represented by a grey level. In this graph, a cut at constant FF gives the light intensity profile I(φ) obtained for this value of the filling fraction.

This figure shows that a moderate value of the filling fraction, typically less than 40%, allows for good directivity of the emission. Indeed, in this figure, it is observed that the emission is directive for FF less than 40% while an expanding (enlarging) of the emission profile is observed for the values of FF greater than about 40%.

The vertical extension h of the patterns 13, 23, 130, i.e. the extension of these patterns in a direction perpendicular to the layers 2, 3, is another parameter that has a notable influence on the extraction properties of the lattice, in particular regarding the directivity of the radiation emitted in far field. For the hollow patterns 13, 23, the vertical extension h is the depth of the patterns, and for the protruding patterns 130, it is the height of these patterns.

Figure 8C:
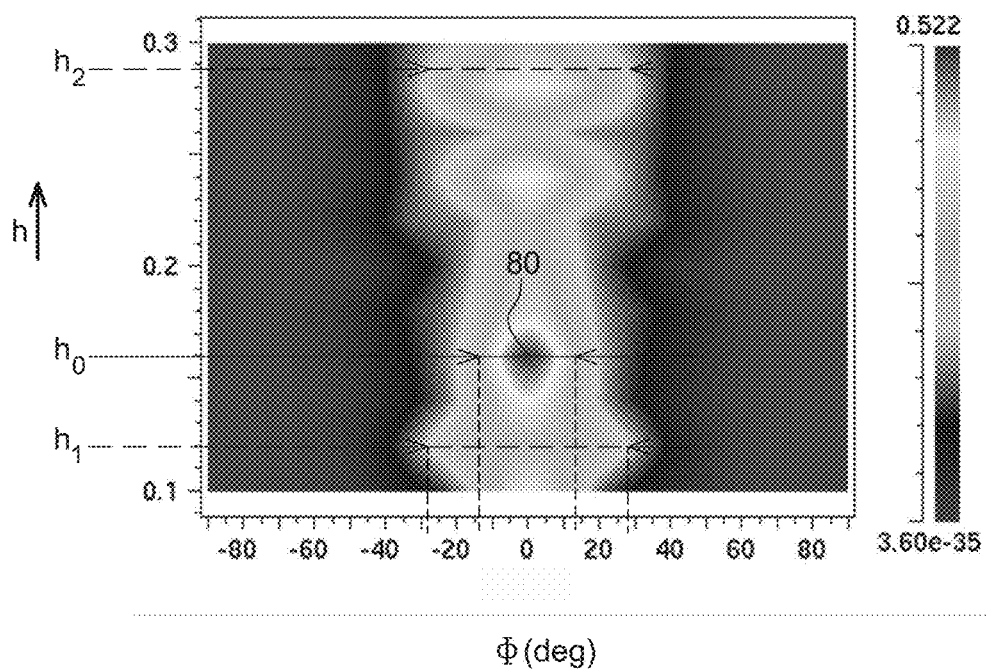
FIG. 8C gathers, in the form of a two-dimensional graph, several light intensity profiles in the far field such as the one of FIG. 7, obtained for three-dimensional contact structures that have patterns of different heights.

FIG. 8C shows the influence of the vertical extension h of the patterns on the directivity in the far field, in the case of the LED 1 of FIGS. 2 and 3.

This figure brings together, in the form of a two-dimensional graph, several light intensity profiles in the far field such as the one of FIG. 7, these profiles corresponding to different values of the vertical extension h. The x-axis corresponds to the angle φ, expressed in degrees. The y-axis corresponds to the vertical extension h of the hollow patterns 13, in arbitrary units. For a given point in the plane (φ, h), the light intensity is represented by a grey level. In this graph, a cut at constant h gives the light intensity profile I(φ) obtained for this value of the vertical extension.

It can be seen in this figure that the vertical extension h effectively has a rather substantial influence on the directivity of the radiation emitted in the far field. It is observed for example that the directivity is better for the value h0~0.16 than for the value h1~0.12 or h2~0.29. For h=h0 (case for which the aspect ratio $R_A$ of the patterns is 3), the intensity profile has an intense and narrow central peak 80 (with a total width at half-maximum of about 30 degrees), interesting for some kinds of applications.

In practice, this extraction lattice leads to a relatively directive emission when the vertical extension of the patterns is rather substantial, for example of about the pitch p of the lattice. To obtain a directive emission, it can therefore be provided for example, like here, that the vertical extension h be greater than or equal to half of the pitch p of the lattice, beneficially comprised between 0.5 times and 1 time the pitch p of the lattice, or between 0.5 times and 1.5 times the pitch p of the lattice.

Here, the inclusions 12; 32 therefore have a narrow shape. They form rather thin antennas that penetrate deeply into the top of the upper layer 3, to extract from this layer the light radiation produced that, otherwise, would remain for the most part confined in this layer. The inclusions 12; 32 have in particular an aspect ratio $R_A$ greater than or equal to 2, for example comprised between 2 and 4, even between 2 and 3.5. This aspect ratio $R_A$ is equal to the vertical extension of each one of these inclusions 12; 32, divided by a transverse dimension of the inclusion 12 (in a plane parallel to the layers), for example divided by its diameter D, or by its width.

Figure 8D:
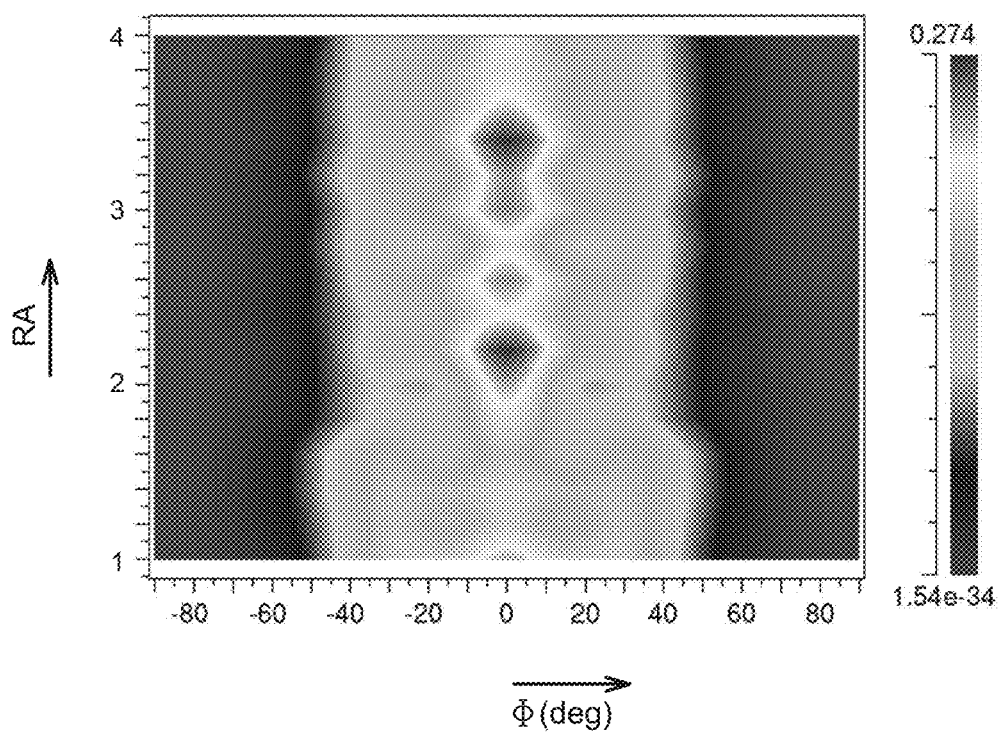
FIG. 8D also gathers, in the form of a two-dimensional graph, several light intensity profiles in the far field such as the one of FIG. 7, obtained for three-dimensional contact structures that have patterns with different aspect ratios.

FIG. 8D is similar to FIG. 8C, but it is obtained for a real metal, with losses, while FIG. 8C shows simulation results that correspond to a perfect metal (without losses). The configuration simulated to obtain this figure corresponds to a pitch p of 200 nm and to inclusions made from Aluminium. To obtain this figure, a simulation was carried out for several values of the height h of the inclusions 12, so as to vary the aspect ratio $R_A$ from 1.2 to 4. In this example, it is indeed observed that an aspect ratio greater than 2, for example comprised between 2 and 3.5 (which here corresponds moreover to an h/p ratio comprised between 0.5 and 0.9), makes it possible to obtain a directive emission.

The fact that the inclusions 12, 32 or the inclusion 120, are relatively deep and narrow is also interesting from an electrical standpoint, because this contributes to increasing the surface area whereon the electrical contact is made between the upper layer 3 and the contact structure 10; 110.

As already indicated, the LED 100 of FIG. 9 is similar, and even identical to the LED 1 of FIG. 1, if only that the inclusions 32, formed of the first electrically-conductive material, extend beyond the front plane $P_F$ that delimits the upper layer 3. These inclusions 32 exceed the front plane $P_F$, and thus penetrate into the contact layer 31, over a height e. This contact structure 110, wherein the elementary antennas formed by the inclusions 32 exceed the front plane PF, is favourable, in terms of extraction efficiencies.

In this alternative, the contact layer 31 has a planar upper face (on the side opposite the upper layer 3), and a lower surface that is not completely planar since it conforms to the protruding reliefs formed by the portion of the inclusions 32 that exceed the front plane $P_F$. For the purposes of comparison, in the alternative of FIG. 2, where the inclusions 12 stop at the edge of the front plane $P_F$, the contact layer 11 has both a planar upper face and a planar lower face.

Another parameter that influences the extraction efficiency is the thickness b of the insulating layer 7 that laterally separates the layers 2 and 3 from the metal vertical walls 8 (FIG. 2). Indeed, these walls play the role of a reflector, and it is therefore desirable to adjust the thickness b in such a way that the interferences, caused by the reflections on these walls, contribute to increasing the extraction efficiency rather than decreasing it. It is thus desirable to adjust the thickness b in such a way as to obtain a given dephasing (for example a null dephasing), when the light radiation traverse the insulating layer 7, reflects on the wall 8, then again passes through the insulating layer 7.

In order to further improve the extraction efficiency, the LED 1 can comprise an anti-reflective layer 14 deposited onto the contact layer 11. Here, the anti-reflective layer 14 is of a single piece. Alternatively, it could however entail a stack formed of several sublayers. This layer is anti-reflective in that it is configured in such a way as to reduce the retroreflected light power, to the core of the LED, by the interface corresponding to the upper face of the contact layer 11. The thickness d of the anti-reflective layer is for example equal to one-fourth of a wavelength $\lambda_o$, wavelength which is the average wavelength of the light radiation in question, in the contact layer 11. The optical index $n_{14}$ of the anti-reflective layer has an intermediate value between the optical index $n_o$ of the contact layer 11, and the optical index $n_1$ of the medium that extends above the anti-reflective layer (for example silica). The material of the anti-reflective layer is for example chosen to have an optical index $n_{14}$ close to the square root of the product $n_o \times n_1$.

From the standpoint of its overall shape, the stack of the layers 2 and 3 is laterally delimited by deep etching, and thus forms a mesa (i.e. a sort of island) made on the receiving structure of the LED 1; 100, receiving structure which itself is supported by the substrate. For the examples shown in the figures, this mesa has a rectangular section (this entails the section of the mesa along a plane parallel to the substrate). The upper layer 3 therefore also has a rectangular section.

Alternatively, the mesa in question could however have a different section, for example a triangular, hexagonal or circular section.

However, a section will beneficially be chosen that has symmetries which are the same as those of the metal lattice mentioned hereinabove (in other terms, a section having the same invariances by symmetry as the lattice itself). Note that this condition is indeed satisfied, in the case shown in FIG. 3. Indeed, the triangular lattice corresponding to this alternative is indeed symmetrical with respect to the axes X and Y which mark the two edges of the rectangular section of the mesa. For this triangular lattice, a triangular or hexagonal section could also have been used (since the lattice and the section of the upper layer would then both have the same symmetries). These latter two cases beneficially make it possible, for all the lattice, to obtain the same number of elements radiating in directions of high symmetries of the lattice (every 60° for the triangular mesh), since a triangular or hexagonal mesh lattice is perfectly inscribed on a hexagonal upper face.

From an electrical standpoint, the lower layer 2 is in contact, via its lower surface 20, with a conductive electrode 5. This electrode 5 is electrically connected to a control circuit, via an interconnection stack (not shown). Regarding the upper layer 3, as already indicated, it is in electrical contact with the contact structure 10; 110, which plays the role of a feeder electrode. Moreover, when several adjacent LEDs are carried out next to one another on the same substrate, the contact layer 11; 31 plays the role of an anode common or of a cathode common to these different LEDs (the contact layer covering all these LEDs).

Second Embodiment: Three-Dimensional Contact Structure Made on the Lower Surface of the Lower Layer In this second embodiment, the contact structure 5' forms a layer in a single piece that, on the side of the lower surface 20' of the LED 1', comes into contact with this surface and conforms to its three-dimensional relief, filling the hollow patterns or the space 131' between the protruding patterns 130'. On the other side, the contact structure 5' is delimited by a rear face 52' that is planar, or at the least planar over most of this face.

Figure 11:
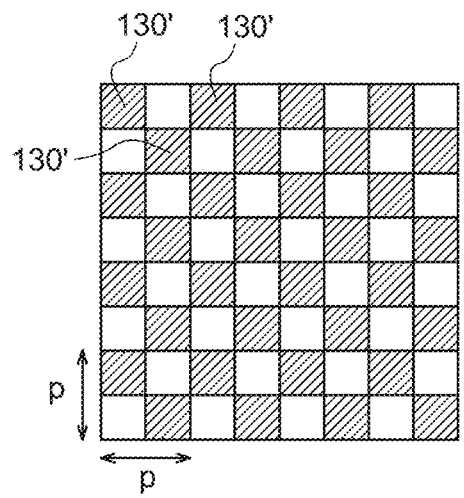
FIG. 11 shows a lower surface of the LED of FIG. 10, seen from below.

FIG. 11 diagrammatically shows the lower surface 20' of the LED 1' of FIG. 10, seen from below. For this example, the patterns are protruding patterns 130'. These patterns correspond to the hatched portions, in FIG. 11. These patterns can for example be cubic or pyramidal. They are regularly distributed over the lower surface 20' by forming a lattice with a square mesh, here a checkerboard lattice of which one square box out of two is occupied by a protruding pattern 130'.

When the protruding patterns 130' are cubic, the gain, in terms of contact surface, is then equal to 3. This gain is equal to:

the total surface area of the surface on which the lower layer 2' is in contact with the contact structure 5', surface area which is therefore here equal to the surface area of the lower surface 20' (non-planar), divided by the total front surface area $A_T$ of the lower surface 20'.

However, nothing imposes that the height of the protruding patterns be equal to the length of the sides of the patterns and therefore that the gain be limited to 3. In the general case the gain in surface for parallelepiped patterns of side I in the plane $P_R$ and of height h is equal to $(4I^2+8hI)/4I^2$ of which the value is greater than 3 when h>I. Without loss of generality, the following examples are given for h=I.

When the protruding patterns 130' are pyramidal (regular pyramid with a square base, with an angle at the top of 90 degrees), this gain is equal to 1.2.

Figure 12:
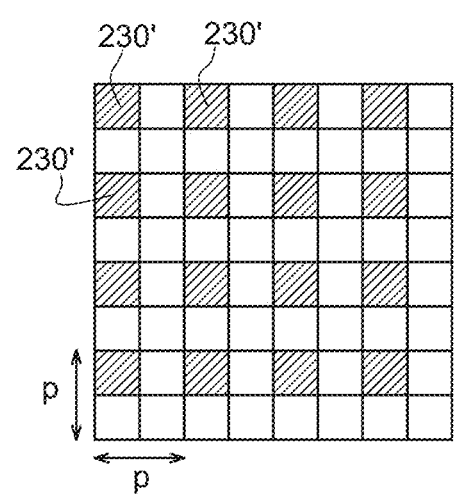
FIG. 12 shows a lower surface of the LED, seen from below, for an alternative of the LED of FIG. 10.

In an alternative of this second embodiment, the patterns 230' presented by the lower surface of the LED 1' are distributed in such a way as to form a square lattice, but less dense than a checkerboard lattice (see FIG. 12; in this figure, the patterns 230' correspond again to the hatched zones). For this type of paving (sometimes called "city block"), only one square box out of four is occupied by one of the patterns 230'. In this case, for cubic patterns, the gain in terms of contact surface is equal to 2. And for pyramidal patterns, it is equal to 1.1.

Alternatively, the patterns presented by the lower surface could be grooves, parallel to one another. In this case, for grooves that have a square profile, with a pitch of the lattice equal to twice the width of one groove, the gain in question is equal to 2. And for grooves with a V-shaped profile having an angle at the top of 90 degrees, contiguous with respect to one another, this gain is equal to 1.4.

Alternatively, other types of patterns, hollow or protruding, and other types of lattices, one- or two-dimensional, can be carried out on the lower surface of the LED.

In other embodiments, not shown, it can be provided that the lower and upper surfaces of the LED both be non-planar, with hollow or protruding patterns, and both provided with a three-dimensional contact structure such as described hereinabove. In this case, the upper surface is provided with a contact structure comprising a contact layer that is at least partially transparent, as for the first embodiment present hereinabove.

Figure 13:
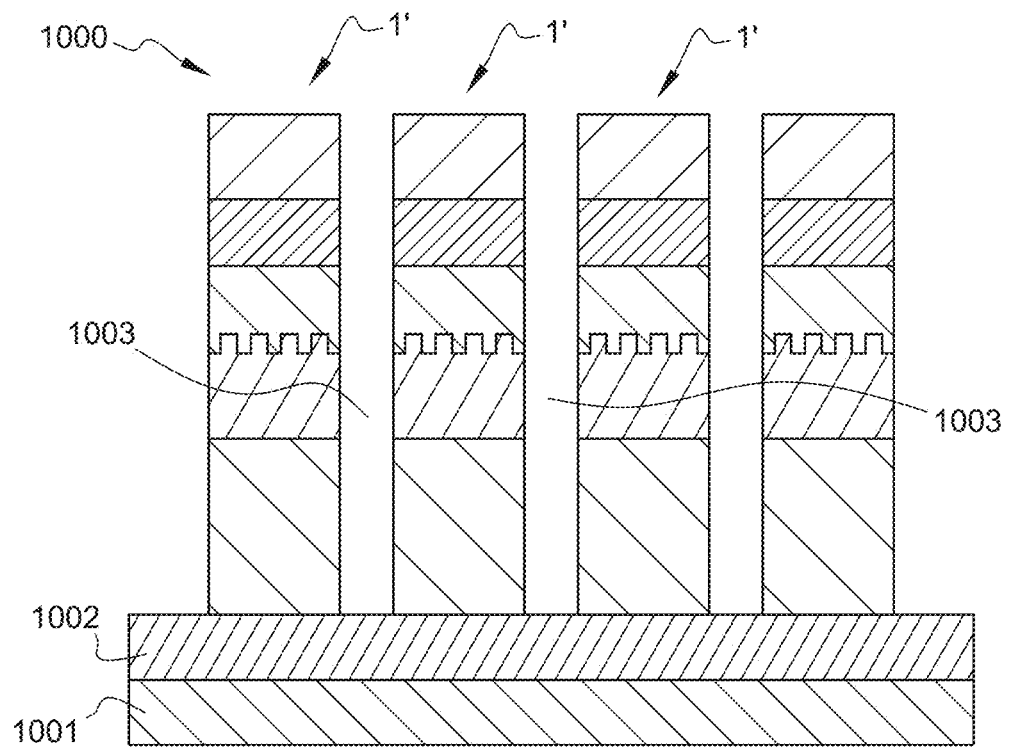
FIG. 13 diagrammatically shows a display screen, at an intermediate stage in its manufacturing.

FIG. 13 diagrammatically shows a display screen 1000 comprising an array of LEDs such as the one, 1', described hereinabove, at an intermediate stage of its manufacture.

Method of Manufacture

Figure 14:
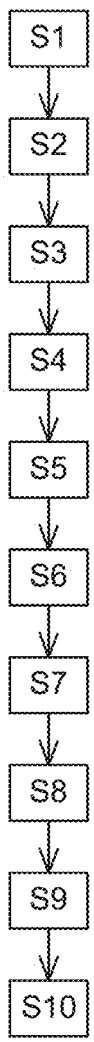
FIG. 14 diagrammatically shows some steps of a method for manufacturing such a display screen, in the form of a flow chart.

FIG. 14 diagrammatically shows a series of steps implemented during a method of manufacturing the display screen 1000.

Figure 15:
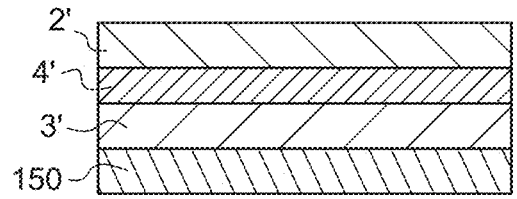
FIG. 15 diagrammatically shows a stack of layers, extended transversally and used as a basis for the manufacture of an array of LEDs, such as that of the display screen of FIG. 13.

This method comprises a step S1 of making a stack comprising the lower layer 2', the upper layer 3', and, between the two, the emissive structure 4', carried out in the form of a stack of planar quantum wells (FIG. 15). At this stage, the layers in question are not yet laterally delimited in order to define the different LEDs 1'. They are therefore of a single piece, and each extends over practically the entire surface of the future screen 1000. The planar quantum wells are for example carried out by epitaxy. This stack is made on a substrate 150 used as a temporary support for this structure. The layer 2', intended to become the lower layer of the LEDs, is carried out on the top of this stack, on the side opposite the substrate 150 (because this stack is then turned over, in order to be transferred onto its definitive substrate; see FIGS. 17 and 18).

Figure 16:
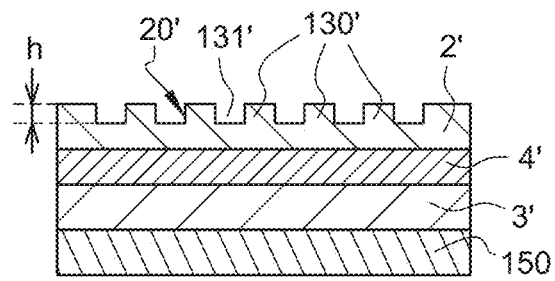
FIG. 16 shows the stack of FIG. 15 after a step of etching one of the layers of the stack to texture the surface of this layer.

The method then comprises a step S2 of etching the lower layer 2', to give it the non-planar three-dimensional shape mentioned hereinabove, with hollow or protruding patterns (FIG. 16). At this stage, the free surface of the lower layer 2', called lower surface 20', is in fact located on top of the stack, which allows it to be etched. The etching in question is carried out over all the lower layer 2', not yet cut. It is therefore carried or for all the LEDs 1' at the same time.

The contact structure 5' is then made, in the step S3, by deposition of a layer made of conductive material that covers the surface 20', textured beforehand.

Figure 17:
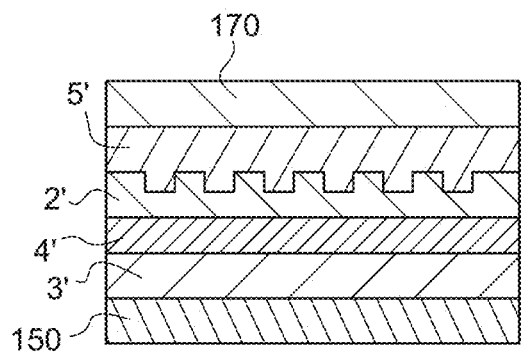
FIG. 17 diagrammatically shows this stack, after having achieved of a three-dimensional electrical contact structure conforming to the textured surface in question.

In the following step, S4, a gluing layer 170 is deposited on the contact structure 5' (FIG. 17). This gluing layer is here formed of a gluing metal, for example titanium Ti.

Figure 18:
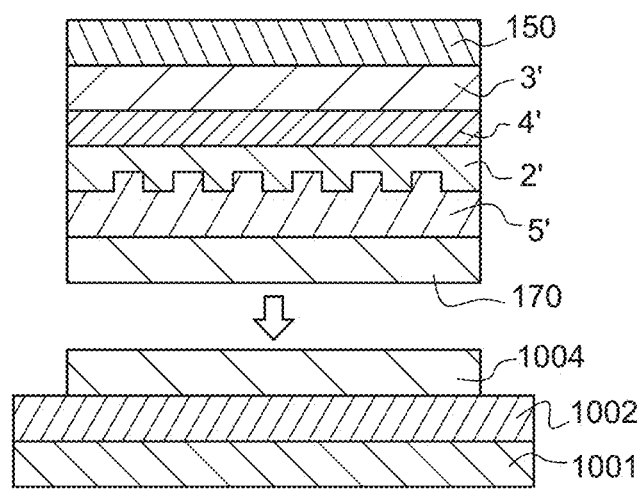
FIG. 18 diagrammatically shows the stack in question, after transfer of the stack of FIG. 17 on a final substrate.

The method then comprises a step S5 of transferring the stack thus made, on a final substrate 1001 (that forms a receiving substrate, for the structure transferred on the latter). This transfer is carried out by turning over the substrate 150 and the stack that it supports then by gluing it, on the side of the lower layer 2', onto a receiving structure 1002 of the LEDs. This gluing is carried out in particular thanks to the gluing layer 170. The gluing can be for example of the molecular gluing type, or, in other words, direct gluing. The receiving structure 1002 of the LEDs can itself be covered with another gluing layer, 1004, in order to facilitate this molecular gluing (see FIG. 18). The receiving structure is carried out on the final substrate 1001 (FIG. 18). It comprises in particular the interconnection stack mentioned hereinabove, that makes it possible to control the different LEDs 1' independently from one another.

After step S5, the method comprises a step S6 of removing the substrate 150, which was used as a temporary support.

The method then comprises a step of deep etching S9, during which the different LEDs are delimited laterally, by etching vertical trenches 1003 in the stack of layers 2', 3', 4' and 5' (FIG. 13). This etching is for example an etching of the RIE (Reactive-Ion Etching) type.

The method then comprises a step S10 of carrying out structures for isolating, protecting and connecting LEDs 1'. The step S10 comprises several sub-steps during which, among others, an electrically-insulating layer is deposited on the flanks of trenches 1003, optional metal walls, vertical, are made in the trenches, and a protective layer is deposited on the top of the LEDs.

To create an array of LEDs that also has a three-dimensional contact structure on the upper surface of each LED, two additional steps S7 and S8 (not shown) are added to the method of FIG. 14, executed between the step S6 of withdrawing the substrate 150 and before the step S9 of delimiting different LEDs. During the step S7, the upper surface of the stack is etched in order to give it a non-planar three-dimensional shape, as in the first embodiment described hereinabove. Then, during the step S8, the contact structure itself is made, in general in several sub-steps due to the composite nature of this structure, formed of two different conductive materials.

To carry out an array of LEDs that also has a three-dimensional contact structure on the upper surface of each LED, but not on its lower surface, a method similar to the method of FIG. 14 is executed, but wherein the steps S2 and S3 are omitted while the steps S7 and S8 are added, between the step S6 and the step S9.

As shown by the method that has just been described, the type of LED 1; 100; 1' which was presented hereinabove lends itself to manufacturing by planar techniques that make it possible to carry out at the same time a large number of adjacent LEDs, these LEDs being delimited with respect to one another only at the end of the method, during the step S9 (step of cutting).

In addition, in the case where only the lower surface 20' of each LED 1' is provided with a three-dimensional contact structure (such as the structure 5'), the step S9 can be carried out without particular alignment of the trenches 1003 with respect to the patterns 130' etched on the lower surface 20', which facilitates manufacturing by as much.

On the other hand, in the case where the upper surface 30 of each LED 1; 100 is provided with a three-dimensional contact structure (such as the structure 10; 110), it can be desirable to align the etching mask used in the step S9 with respect to the patterns 13, 130, 23 etched on this surface, for better control of the optical properties of the extraction lattice formed by these patterns.

The invention claimed is:

1. A light-emitting diode comprising:
a lower layer, at least partially made of a doped semiconductor,
an upper layer, at least partially made of a doped semiconductor, the lower and upper layers having dopings of opposite types,
an emissive structure, that extends between the lower layer and the upper layer and that is adapted to emit a light radiation when an electric current passes through it,
the upper layer being delimited by an upper surface, through which a portion at least of said light radiation exits,
the lower layer being delimited by a lower surface for injecting electric charges,
the upper surface of the upper layer forming a non-planar three-dimensional structure having hollow patterns, said surface being covered by a contact structure made of electrically-conductive materials, the contact structure extending against said surface, conforming to said non-planar surface,
wherein, for each of said patterns, an aspect ratio, equal to the extension of said pattern in said upper layer and in a direction perpendicular to said upper and lower layers, divided by a transverse dimension of said pattern in said upper layer and in a plane parallel to said upper and lower layers, is greater than or equal to 2, wherein the contact structure comprises:
a first electrically-conductive material, that fills the hollow patterns, and
a contact layer made of a second electrically-conductive material that is at least partially transparent for said light radiation, the contact layer covering said upper surface and coming into contact with both the first electrically-conductive material and the doped semiconductor of the upper layer.

2. The light-emitting diode according to claim 1, wherein said patterns, regularly repeated, form a periodic lattice of pitch p, or a quasi-periodic lattice.

3. The light-emitting diode according to claim 2, said patterns forming said periodic lattice of pitch p, wherein, for each of said patterns, a ratio equal to said transverse dimension of said pattern divided by the pitch p of the lattice is comprised between 20% and 40%.

4. The light-emitting diode according to claim 1, occupying, in a plane parallel to the upper and lower layers, a total area less than 100 square microns, or even less than 10 square microns.

5. The light-emitting diode according to claim 1, wherein the first electrically-conductive material is reflective for said light radiation.

6. The light-emitting diode according to claim 1, wherein the upper surface, that forms said three-dimensional structure, extends between a front plane and a recessed rear plane, the front and rear planes being parallel to said layers, and wherein the first conductive material, that fills the hollow patterns, forms one or more inclusions that extend beyond said front plane, into the contact layer.

7. The light-emitting diode according to claim 1, wherein:
the upper surface occupies, in projection on a plane parallel to said upper and lower layers, a total front surface area $A_T$,
the hollow patterns occupy, in projection on a plane parallel to said layers, a recessed surface area $A_R$,
and wherein a filling rate, equal to the recessed surface area $A_R$ divided by the total front surface area $A_T$, is less than 30%.

8. The light-emitting diode according to claim 1, comprising an anti-reflective layer that extends over the contact layer.

9. The light-emitting diode according to claim 1, wherein said patterns have, in one direction at least, a dimension greater than 0.1 micron.

10. A display screen comprising an array of light-emitting diodes each in accordance with claim 1.

11. The light-emitting diode of claim 1, wherein the first electrically-conductive material entirely fills each of the hollow patterns.

12. A method for manufacturing a light-emitting diode, comprising:
making a stack comprising:
a lower layer, at least partially made of a doped semiconductor,
an upper layer, least partially made of a doped semiconductor, the lower and upper layers having dopings of opposite types, and
an emissive structure that extends between the lower layer and the upper layer and that is suitable to emit a light radiation when an electric current passes through it,
transfer of the stack thus made on a final substrate, the lower layer being located on the side of the substrate, the method further comprising:
etching of an upper surface of the upper layer, to form a non-planar three-dimensional structure having hollow patterns, each of said patterns having an aspect ratio, equal to the extension of said pattern in a direction perpendicular to said layers, divided by a transverse dimension of said pattern in a plane parallel to said layers, which is greater than or equal to 2, and
on the surface thus etched, making a contact structure made of electrically-conductive materials, the contact structure extending against said surface, conforming to said surface,
wherein the contact structure comprises:
a first electrically-conductive material, that fills the hollow patterns, and
a contact layer made of a second electrically-conductive material that is at least partially transparent for said light radiation, the contact layer covering said upper surface and coming into contact with both the first electrically-conductive material and the doped semiconductor of the upper layer.

* * * * *